(12) United States Patent
Douglas (10) Patent No.: US 6,614,211 B1
(45) Date of Patent: Sep. 2, 2003

(54) NON-CONTACT DETECTOR FOR SENSING A PERIODICALLY VARYING MAGNETIC FIELD

(75) Inventor: Phillip N. Douglas, Clayton, NC (US)

(73) Assignee: Santronics, Inc., Sanford, NC (US)

( * ) Notice: Subject to any disclaimer, the term of this patent is extended or adjusted under 35 U.S.C. 154(b) by 0 days.

(21) Appl. No.: 09/283,499

(22) Filed: Apr. 1, 1999

(51) Int. Cl.[7] .......................... G01R 19/00; G01R 31/02
(52) U.S. Cl. .......................................... 324/67; 324/529
(58) Field of Search .................... 324/66, 67, 126, 324/117 R, 117 H, 227, 244, 526, 529

(56) References Cited

U.S. PATENT DOCUMENTS

| | | | |
|---|---|---|---|
| 3,617,865 A | | 11/1971 | Hakata ........................... 324/3 |
| 3,745,446 A | | 7/1973 | Norris ............................ 324/3 |
| 3,831,086 A | * | 8/1974 | Pesto ........................... 324/531 |
| 3,991,363 A | | 11/1976 | Lathrop ........................ 324/52 |
| 4,596,950 A | | 6/1986 | Lienhard et al. ............. 324/117 |
| 4,603,365 A | | 7/1986 | Nakamura ................... 360/113 |
| 4,639,674 A | | 1/1987 | Rippingale .................. 324/326 |
| 4,660,113 A | | 4/1987 | Nomura et al. ............. 360/113 |
| 4,673,827 A | | 6/1987 | Sommer ....................... 307/116 |
| 4,686,454 A | | 8/1987 | Pecukonis ..................... 324/67 |
| 4,945,305 A | | 7/1990 | Blood ..................... 324/207.17 |
| 4,992,133 A | | 2/1991 | Border ........................ 156/498 |
| 5,041,780 A | | 8/1991 | Rippel ..................... 324/117 H |
| 5,278,500 A | | 1/1994 | Seitz ............................ 324/249 |
| 5,717,326 A | * | 2/1998 | Moriwaki ................. 324/117 H |
| 5,933,003 A | * | 8/1999 | Hebing et al. ........... 324/117 R |
| 6,130,539 A | * | 10/2000 | Polak ............................ 324/326 |
| 6,222,358 B1 | * | 4/2001 | Wottrich ...................... 324/326 |
| 6,323,634 B1 | * | 11/2001 | Nakagawa et al. ..... 324/117 R |

OTHER PUBLICATIONS

Dynatel Corporation, "The Simplified Cable Locator System For The Modern Telephone Plant", Jan., 1974.
GMR Materials: Theory adn Applications, *The Journal of Applied Sensing Technology*, Sep. 1994, Jay Brown, Non-Volatile Electronics, Inc. pp. 42, 43, 44, 47, and 48.
Technology Advances, "Giant Magnetoresistance Technology Paves The Way For Magnetic Field Sensing", *Electronic Design*, Nov. 21, 1994, 2 pages.

* cited by examiner

Primary Examiner—Jay Patidar
(74) Attorney, Agent, or Firm—Moore & Van Allen PLLC (57) ABSTRACT

The present invention is directed to a non-contact detector for sensing a periodically varying magnetic field. The non-contact detector includes a probe having at least one magnetic sensor used to sense a magnetic environment generated by current running through a conductor. The detector includes means for periodically varying the magnetic environment and sensing means that is associated with each magnetic sensor that produces an electrical signal representative of the change in the magnetic environment. The detector also includes means for delivering a usable representation to a user in response to the sensing of the periodically varying magnetic environment.

16 Claims, 6 Drawing Sheets

NON-CONTACT DETECTOR FOR SENSING A PERIODICALLY VARYING MAGNETIC FIELD

FIELD OF THE INVENTION

This invention relates to magnetic field, electric current, and frequency sensing, and more particularly to a high-sensitivity, non-contact magnetic field, direct current, frequency, and alternating current detector.

BACKGROUND OF THE INVENTION

Non-contacting AC current detectors are known in the art but suffer from some significant draw-backs. These detectors do not readily detect low values of DC current without invading the circuit or, if done magnetically, by first calibrating the instrument for a particular location to correct for the Earth's or some other magnetic field or interference. Furthermore, these devices tend to be large and very expensive.

Because of these problems, the least expensive and bulky method of determining whether DC current is flowing through a conductor is by interrupting the circuit in order to connect an ammeter to the conductor as part of the circuit. This method creates its own problems. For example, when trying to locate a short—e.g., to ground—in a circuit, it requires multiple tests along the length of the circuit.

Non-contact DC current detectors typically sense the magnetic field created by a DC current. The most common method to do this is by use of a Hall-effect sensor. Hall effect sensors are relatively small and inexpensive. Previously, Hall effect sensors typically generated only a very small raw signal of approximately five millivolts in a magnetic field on the order of one hundred gauss. As a result, they were ineffective at sensing small magnetic fields and were usually used in connection with permanent magnets. Recent improvements in Hall effect sensors have allowed the sensors to generate signals in the range of two to ten millivolts in a magnetic field on the order of one gauss. Hall effect sensors do not, by themselves, give an output linear to the magnetic field in which the sensor is placed. However, the devices are usually sold with associated electronics which convert the output into a linear function relative to the surrounding magnetic field. Thus, the commercially available products incorporating Hall-effect sensors usually do have linear outputs relative to their surrounding magnetic field. Specifically, a list of such commercially available Hall effect sensors would include: MLX90215 Precision Programmable Linear Hall Effect Sensor, Datasheet revision 2.1 (Apr. 10, 1998), Melexis Microelectronic Integrated System, 15 Sutton Road, Box 837, Webster, Mass. 01570-0837; A3515LUA Ratiometric, Linear Hall-Effect Sensors for High Temperature Operation, Datasheet 27501.10, Allegro MicroSystems, Inc., 115 Northeast Cutoff, Box 15036, Worcester, Mass., 01615-0036; F. W. Bell Hall Generators BH-200 Series, FH-301/FH-500 Series, GH-600/GH-700/GH-800 Series, BH-700 Series, BH-850, BH-900 Series, Datasheet, F.W. Bell Corp., 6120 Hanging Moss Road, Orlando, Fla., 32807, (407) 678-6900; Asahi Hall Elements HW-101/HW-104/HW-105/HW-108/HW-109/HW-300/HW-302/HW-305/HZ-106C/-HZ302C/HZ302H/HG-106C, Datasheet, Asahi Kasei Electronics Co., Ltd., 1-1-1 Uchisaiwai-Cho, Chiyoda-Ku, Tokyo 100, Japan.

Anisotropic magnetoresistive (AMR) sensors are also available and can sense low-strength magnetic fields. Examples of anisotropic magnetoresistive sensors include: Honeywell HMC1001 & HMC1002 One and Two Axis Magnetic Sensors, Datasheet 900150, Rev. E, 12/97, Honeywell, Inc., Solid State Electronics Center, 12001 State Highway 55, Plymouth, Minn. 55441, (800) 323-8295; Honeywell HMC/HMR Series, Datasheet 900187, 10/96, Honeywell, Inc., a Solid State Electronics Center, 12001 State Highway 55, Plymouth, Minn. 55441, (800) 323-8295.

The giant magnetoresistive (GMR) sensor has been available for some time. An example of a GMR sensor includes a resistive bridge circuit of four magnetoresistive devices connected between voltage bias input terminals and difference output terminals. Two legs of the resistive bridge circuit are positioned within the magnetic environment and two legs of the bridge circuit are shielded from the magnetic environment. The resistive bridge circuit experiences a change in electrical resistance of the two legs that are positioned within the magnetic environment in response to a change in the bridge circuit's magnetic environment.

At the sensitivity levels exhibited by the GMR, AMR, or improved Hall effect sensors, magnetic fields generated by relatively low-current electrical and electronic devices can be detected. Because of this sensitivity, a GMR sensor or a Hall effect sensor, like an AMR sensor, can detect the Earth's own magnetic field. However, the strengths of these gross fields and the fields sought to be detected by an AMR, GMR or Hall effect sensor may be of the same order of magnitude. The AMR, GMR or Hall effect sensors cannot reliably detect, much less easily measure low DC currents without eliminating the effects of the earth and other, gross magnetic fields.

U.S. Pat. No. 4,639,674, granted to Rippingale on Jan. 27, 1987, discloses electromagnets wrapped around magnetic cores (col. 2, In. 65 though col. 3 In. 20) as the sensing elements. Rippingale thereby teaches away from the use of magnetoresistive components as the way to follow conductors that have been energized with a varying electrical current signal. This prior art has difficulty separating and eliminating the signals the user wants to detect from the ambient noise signals.

U.S. Pat. No. 3,991,363, granted to Lathrop on Nov. 9, 1976, also discloses the use of coils to sense magnetic fields, thus teaching away from the use of magnetoresistive devices. The use of coils can present difficulties in designing devices which require greater sensitivity with less bulk in the sensor. Additionally, Lathrop calls for finding electrical leakage by making electrical (ohmic) contact with the conductive ground return conductor path.

U.S. Pat. No. 5,041,780, granted to Rippel on Aug. 20, 1991, discloses the use of two oppositely-polarized magnetoresistive magnetic flux sensors to cancel the extraneous magnetic environment when sensing both sides of the circular magnetic field around an electrical conductor. This device uses a simple amplifier and meter to display the flux level to the operator.

SUMMARY OF THE INVENTION

The purpose of this invention is to provide a non-contacting method of sensing an electromagnetic field and further allows for sensing, in a non-contact manner, low-level electrical currents by placing sensors near or in opposing positions on either side of a field conductor to be sensed, and adding the output algebraically. This allows common field effects to be canceled and the device to sense only that, field generated within the sensing zone.

In accordance with the present invention, a probe comprising at least two sensor elements is combined with means for sensing a change in an electrical characteristic of the sensor environment, the sensors being arranged so that their electrical characteristics are sensed in a mutually opposite sense, with the electrical signals representing the sensor electrical characteristics being algebraically added to produce an output.

Also in accordance with the present invention, a probe comprising at least one sensor element is used to sense the presence of an electromagnetic field that varies in a periodic manner with changes in an electrical characteristic of the sensor being sensed only at said periodic rate.

BRIEF DESCRIPTION OF THE DRAWINGS

The present invention will be more fully understood by reference to the following detailed description when considered in conjunction with the following drawings wherein like reference numbers denote the same or similar parts shown throughout the several FIGURES in which.

DETAILED DESCRIPTION

Figure 1:
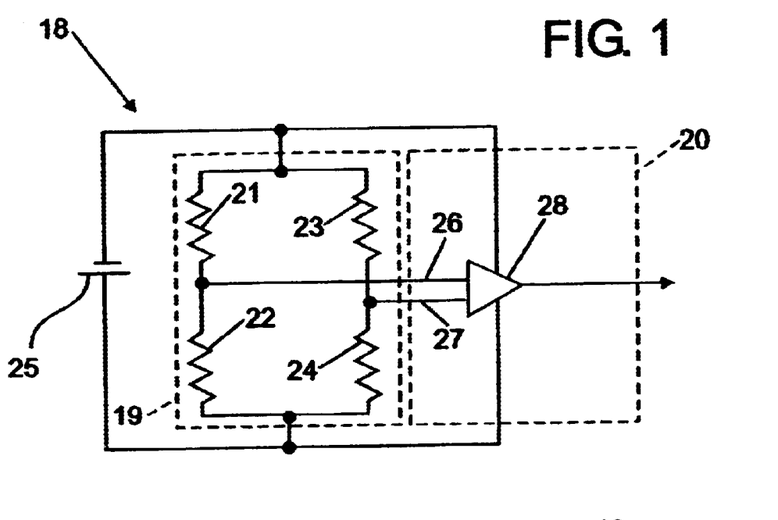
FIG. 1 is a schematic diagram of a resistor bridge magnetic field sensor of the type which may be used with the present invention with a differential amplifier to produce an output signal in the presence of a magnetic field.

Referring now to the accompanying drawings and more particularly to FIG. 1, there is shown a sensing component 18, having a known type of magnetic sensor element 19 and a sensor circuit 20. In a preferred embodiment, the sensor element 19 is a GMR type. Alternatively, the sensor element 19 may be an AMR or Hall effect sensor capable of generating a signal in the specified range. Applications incorporating AMR and Hall effect sensors are described in the examples provided in the Background section above.

In FIG. 1, the sensing component 18 includes the serially connected magnetoresistive components 21–24 of sensor element 19 that are connected in the serial-parallel combination as shown, across a voltage source 25, such as a battery, preferably the common 9-volt type. Any change in the magnetic field environment of the sensor element 19 proportionately changes the magnitude of the sensor element 19 output voltage signal on lines 26 and 27. Preferably the sensor element 19 output signal is in the range of two to ten millivolts in a magnetic field on the order of one gauss. Ideally, the output signal of sensor element 19 is conditioned by the sensor circuit 20 so that the sensing component 18 generates a signal of three millivolts in a magnetic field on the order of one gauss.

In a preferred embodiment using a GMR sensor, the sensor circuit 20 includes a differential amplifier 28, which is also preferably connected to the battery 25, and which has its two input terminals connected to the lines 26 and 27 of the sensor element 19. Therefore, any change in the magnetic environment of the sensor element 19 results in a change in the voltage at the output of the differential amplifier 28, which. functions to sense the change in the resistance of the magneto resistors of the sensor element 19.

Since the resistance of the magnetoresistive components 21–24 of the sensor element 19 is basically a linear function of the magnetic field strength of the environment of the sensor element 19, the output voltage of the differential amplifier 28 represents the magnitude of the total magnetic environment of the sensor element 19.

Figure 2:
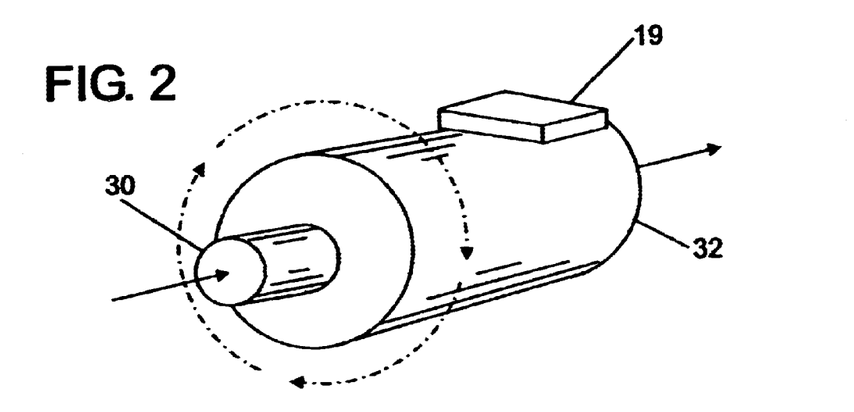
FIG. 2. is an illustration of the use of a sensor to detect the presence of a magnetic field circulating around a current carrying wire.

Referring now to FIG. 2, one useful application of the present invention is to sense the presence of and measure the magnitude of the electrical current flowing in an insulated electrical conductor 30 without the need to invade the conductor's electrical circuit. When an electrical current flows in a conductor 30, a magnetic field circulates around the conductor. The sensor element 19 need only be placed in proximity to this conductor 30 to sense the magnetic field surrounding the conductor and thus the current flowing through the conductor. Since the strength of the magnetic field diminishes with increasing distance from the conductor 30, the sensor element 19 is preferably placed as close as possible to the conductor 30 and preferably in contact with the conductor's insulator 32.

In the arrangement depicted in FIG. 2, with only one sensor element 19, the earth's magnetic field and other positional factors will be present to influence the electromagnetic environment being sensed or measured. One straightforward method to try to minimize errors due. to these extraneous factors is to use a potentiometer or similar device to zero the output from the differential amplifier before bringing the sensor element 19 close to the conductor 30.

Figure 3:
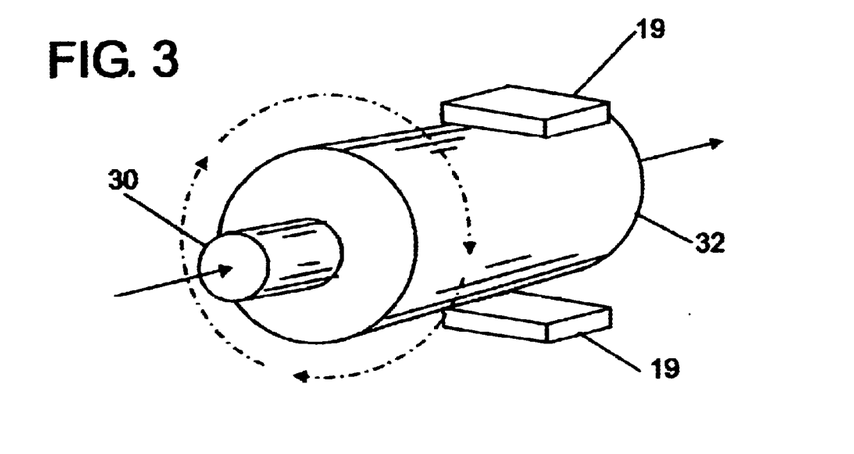
FIG. 3 illustrates the use of two sensors on opposite sides of a conductor for balancing to minimize error due to extraneous magnetic fields.

In an effort automatically to neutralize the earth's magnetic field and other positional influences, FIG. 3 shows the use of two sensor elements 19 preferably positioned on opposite sides of a conductor 30. The magnetic field that exists around a current-carrying conductor causes magnetic flux in one polarity direction on top of the conductor and the opposite polarity direction on the bottom of the conductor. However, the earth's magnetic field is polarized the same on both sides of the conductor 30. Therefore, it is possible to use the two sensor elements 19 to cancel out the effect of the earth's magnetic field and other fairly uniform positional discrepancies which might interfere with accurate sensing and measuring of the current within the conductor 30.

Figure 4:
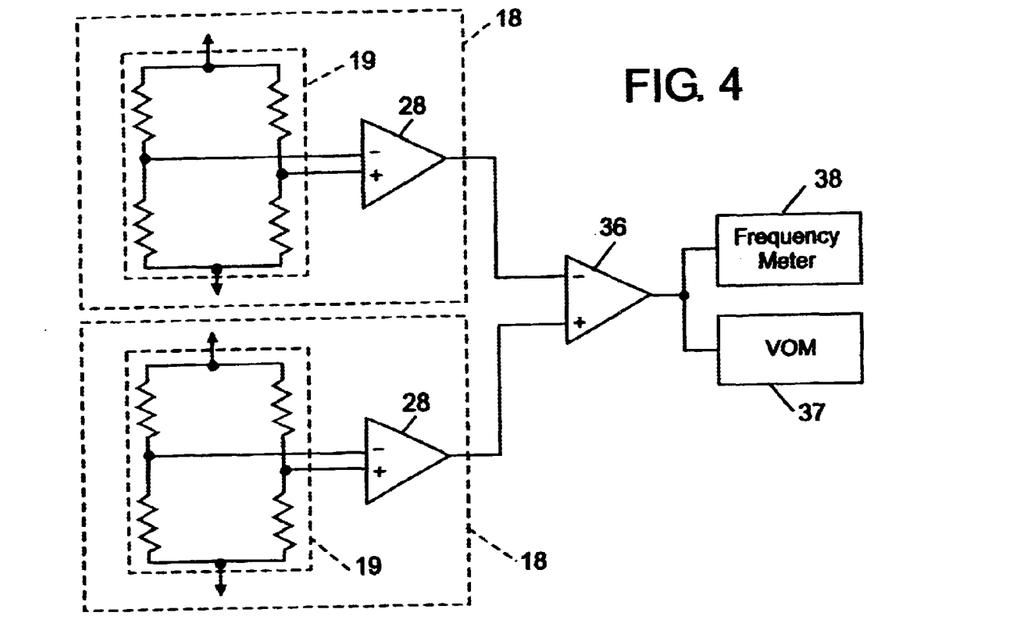
FIG. 4 shows two of the circuits of FIG. 1 arranged to exemplify the implementation of the balancing possible with the circuit of FIG. 4 and also to balance variations in the applied supply voltage.

FIG. 4 shows a circuit for implementing the balancing possible with the use of two sensor elements 19 as shown in FIG. 3. The output of each differential amplifier 28 contains an oppositely polarized representation of the magnetic field resulting from the current in the conductor 30. However, the output of each differential amplifier 28 also contains a representation in the same polarity of the earth's magnetic field, etc.

The outputs of the two differential amplifiers 28 are connected to the inputs of another differential amplifier 36, which delivers a usable representation of the magnetic field being sensed by the sensor elements 19.

A differential amplifer produces an output that is proportianl to the difference between the voltages at it two inputs. All of the extraneous effects from the earth's magnetic field, power supply discrepancies, etc., that appear on the outputs of the two differential amplifiers 28 are all in the same polarity. Consequently, all these positional discrepancies do not result in a difference between the outputs of the differential amplifiers 28. Therefore, the differential amplifier 36 ignores those similarly-polarized portions of the outputs from the differential amplifiers 28 and looks only at whatever causes a difference between the output of the two differential amplifiers 28, which is the oppositely-polarized effects of the magnetic fields from the current flowing in the conductor 30. That difference effect is then reflected in the output of the differential amplifier 36, as a voltage representative of the current flowing in the conductor 30.

The output of the differential amplifier 36, as a usable representation of the current flowing in the conductor 30, can be directly to operate any of a number of different types of alarms, indicators or usage devices. For example, such a representation can operate an audible or visual alarm, form the input to a voltmeter 37, either digital or analog, or can be digitized and delivered to a computer, etc. Such a representation can also be converted, by a frequency meter 38, to a representation of the frequency of any signal or alternating current that is present as a current in the conductor 30. The frequency meter 38 or any one of many types of devices capable of producing an output signal representing the frequency of its input signal can be used as the usable representation of the frequency flowing in the conductor 30.

The field strength around a conductor 30 is generally inversely proportional to the first power of the distance from the conductive path. Since the sensor elements 19 are paired in FIG. 3 and their outputs are, in effect, inversely or oppositely, algebraically summed, the sensors need not necessarily be pressed to the conductor 30 or its insulation 32 but can be a fixed distance apart on opposite sides of the conductor. Therefore, as one sensor element 19 is moved away from the conductor 30, its output is thus reduced; and the other sensor element 19 is simultaneously moved toward the conductor, its output is thus increased. The first-power relationship between distance and field strength will assure that the differences in the outputs that result from sensor element movement will cancel out, except for secondary effects.

Figure 5:
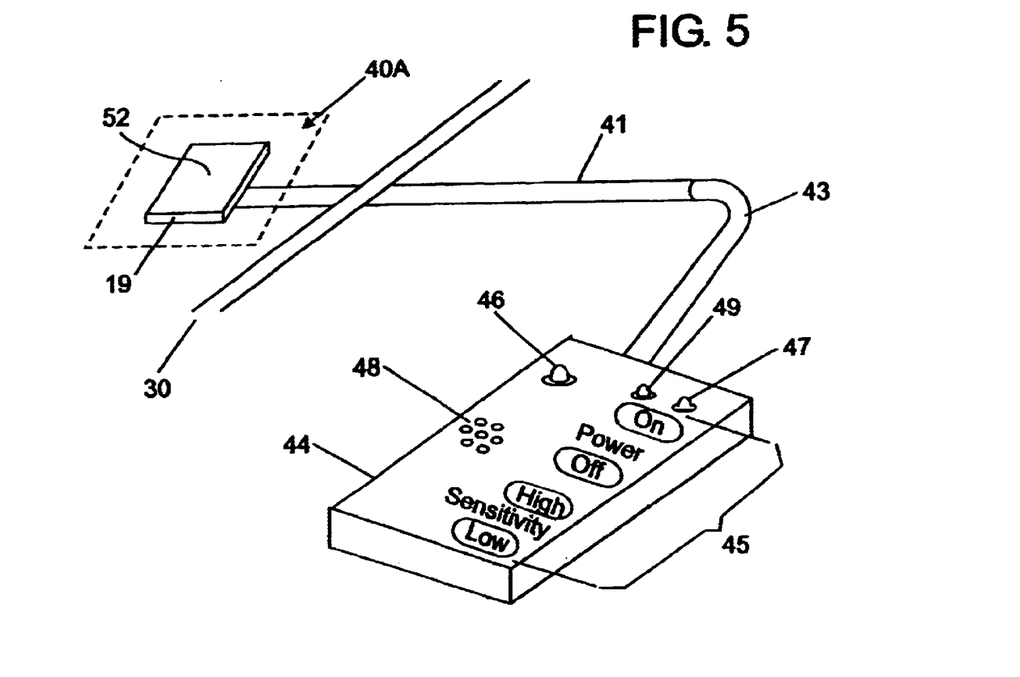
FIG. 5 shows an exemplary physical arrangement of the mounting of a sensor with a circuit pack to sense small magnetic fields using the circuit of FIG. 1.

FIG. 5 shows the preferred physical configuration of a wand-mounted probe 40A that includes one or more of the sensor elements 19, where the probe 40A is mounted to one end of a supporting member 41 the other end of which is connected to cable 43. Such a probe might be useful for finding a short circuit in one of the wiring harnesses (not shown) of an automobile chassis where there is very little room for test instruments, or time for dividing and individually testing the many sections of each conductor of a circuit that is shorted to chassis ground of the automobile.

Figure 6:
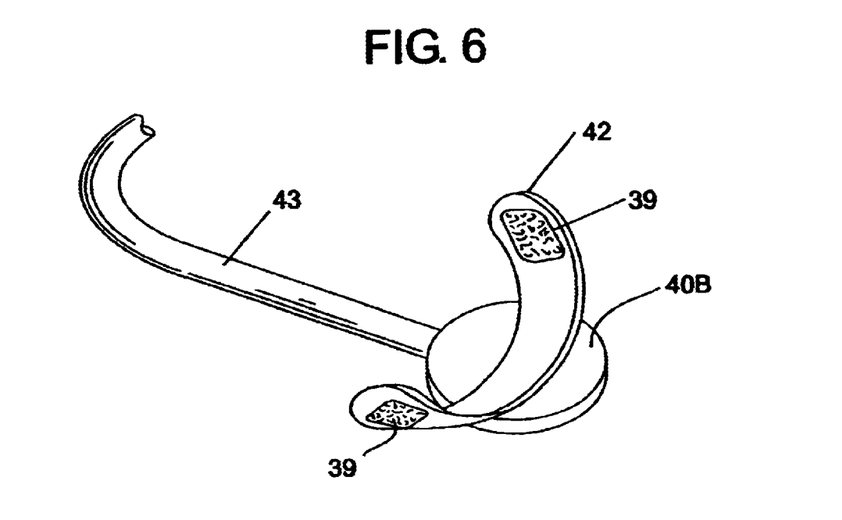
FIG. 6 shows an alternative embodiment of the probe configuration of FIG. 5.

FIG. 6 shows an alternate probe configuration 40B that includes one or more of the sensor elements (see FIG. 5) where the probe 40B is in the form of an attachable strap containing sensor elements (see FIG. 5) wherein the probe 40B is mounted onto a mounting member in the form of a human finger. When using the finger-mounted probe 40B, a technician uses some straps 42 to attach the probe 40B to his finger. Opposing fastener pads 39 are used to hold the straps 42 together around the technician's finger. A fastening pad such as a hook field and opposing lint is preferred. Such a fastening pad is sometimes referred to by the trade name Velcro. In the following description, example probe 40B is interchangeable with the preferred probe 40A except where noted.

Referring back to FIG. 5, a circuit pack 44 with probe 40A attached contains the necessary power supply, differential amplifier(s), and other electronics to operate with the minimally-sized probe 40A. Preferably, the circuit pack 44 would include a membrane keypad 45 with associated electronics to allow the user to turn the device on and off as well as buttons on the keypad to alter the sensitivity of the device from high to low. Preferably, the existing sensitivity setting is displayed by a high sensitivity lamp 47 and a low sensitivity lamp 49. Only one of these lamps 47 or 49 will be illuminated at any given time. The sensitivity being altered is that of differential amplifier 28. Preferably, the sensitivity of differential amplifier 28 may be adjusted to allow the user to gradually narrow the search for the shorted circuit. This sensitivity adjustment may take the form of a volume-control knob or the local/distant button found on many FM radio sets.

The differential amplifier 28 may, in some applications, be overly sensitive to changes in the intensities of the magnetic fields being sensed and thus to the voltage output of the Wheatstone bridge circuit. Therefore, a person having ordinary skill in the electronics circuit art will readily understand how the sensitivity of the differential amplifier can be adjusted to accommodate quite different magnitudes of the magnetic fields being sensed and thus the electric current levels that generate those magnetic fields. For example, the differential amplifier can be adjusted to a higher sensitivity in a broad search to find the general location of a short circuit. The differential amplifier sensitivity can then be decreased, with the sensor being swept more closely along the suspect conductor, until the spot is noted where the magnetic field drops sharply. This is then the site of the shortcircuit, e.g., between the conductor and a ground or common return.

To operate the device, an oscillating current is introduced into the shorted circuit, preferably by replacing the circuit fuse with an oscillator, chopper or other means of producing an oscillating or rapidly varying current into the shorted circuit. The electrical power for the oscillator, chopper, etc., can be obtained at the fuse plug or from an external battery. The technician then reaches the wand-mounted probe 40A or introduces the finger-mounted probe 40B into whatever confined space he must in order to move the probe 40A or 40B along the harness that contains the shorted circuit.

When the electronics in the circuit pack 44 senses a magnetic field oscillating with the periodicity or at the frequency of the current oscillations in the shorted circuit, it illuminates a lamp 46 and/or makes a noise at a speaker 48. The use of an oscillating current allows the electronic circuit in the circuit pack 44 to ignore all magnetic fields other than those that oscillate with the correct periodicity or at the right frequency.

When using the wand-mounted probe 40A, a technician grasps the probe by the supporting member 41 and moves the flat end 52 of the probe containing sensor elements 19 along the circuit being tested. Preferably, the flat end 52 is kept perpendicular to the electrical conductor 30. When using the finger-mounted probe 40B (see FIG. 6), the technician follows the cable-harness with the finger to which the probe is attached. As the technician moves the probe along the circuit, he can immediately tell when he passes the location of the short circuit; because, at that point, the oscillating current will pass into the chassis ground of the automobile and not flow into the rest of the shorted wire. Repair efforts can then be limited only to the spot so indicated.

The probe 40A need only contain a single sensor element 19 since the use of the oscillating current allows the circuitry within the circuit pack 44 to be made blind to any but the frequency of the oscillating current. If oscillating current is not to be used or if the nature of the magnetic environment makes it desirable, two sensor elements 19 can be mounted on the probe 40A on either side of a groove through which the wiring harness can be moved relative to the probe 40A.

Figure 7:
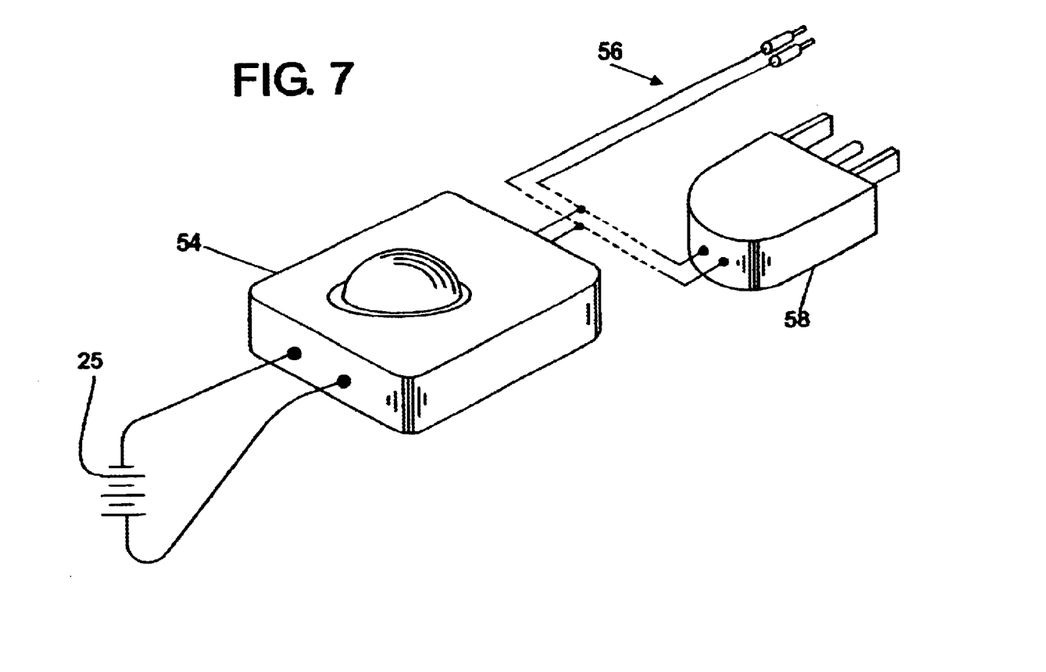
FIG. 7 shows an illustrative AC generator to generate a periodically varying magnetic field to facilitate the use of the sensor arrangement of FIG. 6.

FIG. 7 shows an example of a signal inserter 54 for conveniently introducing the oscillating current into the shorted wire. The signal inserter 54 includes any necessary oscillator or frequency generator, either sinusoidal, square wave or other, any necessary current-limiting circuitry, as well as external battery 25, if needed, and two wires 56. The wires 56 could preferably have, at their outer ends, clips for connecting the signal inserter 54 in place of a fuse blown by the short circuit. The oscillating current is then introduced into the shorted circuit at the convenient location of the automobile's fuse box, and the "hot" side of the fuse box and the shorted wire can then provide battery power to the signal inserter 54.

Alternatively, the probe 40A of FIG. 5 or the probe 40B of FIG. 6 can be used in a stationary location to find shorts in a 60 Hz AC power circuit, the wires 56 can be appropriately connected (as also shown in FIG. 7) to a typical electrical service plug 58 rather than to fit into a fuse socket. With the blown fuse or open circuit breaker keeping 60 Hz electric power out of the shorted circuit, the plug 58 is inserted into any handy electrical outlet (not shown); and a separate battery 25 is used to power the signal inserter 54. The oscillating current is then inserted into the shorted circuit through the outlet. The technician then moves the probe 40A of FIG. 5 along the path of the shorted circuit until the circuit pack 44 tells the technician that the oscillating magnetic field is present, if the sensor is moved from below the short; or that the oscillating magnetic field is no longer present, if the sensor is moved from the oscillating source toward the short.

Figure 8:
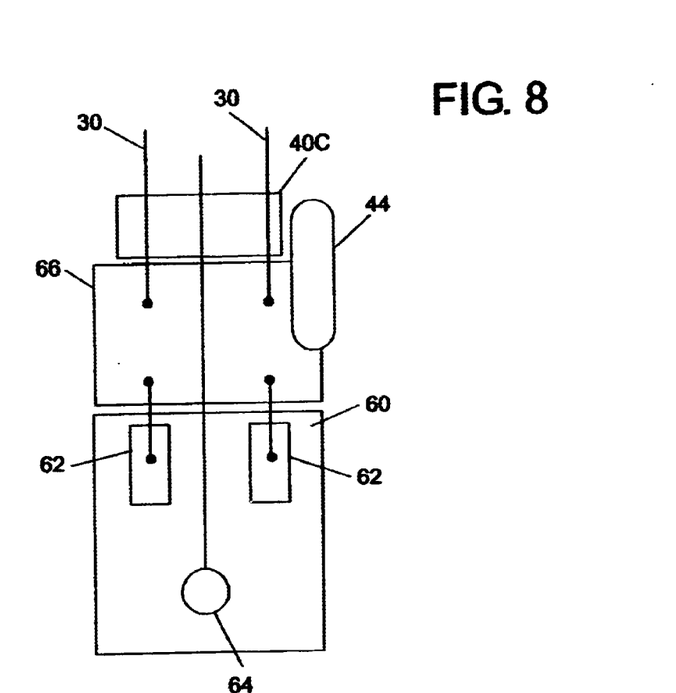
FIG. 8 schematically shows the implementation of a magnetic current sensor as a ground-fault protection device.

FIG. 8 schematically shows the present invention as applied to a ground fault current interrupter (GFCI). This is a device which senses a difference in current between the hot and neutral wires of an appliance (not shown)—which indicates a current leak within the appliance or between the appliance and an external ground—and turns off power to the appliance before an operator can receive a nasty or even lethal shock. A GFCI can be mounted either in the electrical plug of the appliance or in the outlet into which the appliance is plugged.

A two-prong AC plug or outlet 60 with power connectors 62 also has a ground prong or socket 64. The two power connectors 62 are connected through a relay 66, which can be either mechanical latching or electronic, as needed. A probe 40C, that includes two sensor elements (see FIG. 5), monitors the magnetic field around the conductors 30 attached to the hot or neutral prongs 62. When any difference is sensed between the current flowing in the hot and neutral conductors 30, a circuit pack 44, connected to the probe 40C and powered by the voltage at the power connectors 62, triggers the operation of the relay 66 to open and isolate the appliance from electrical power. The circuit of FIG. 4 can be used to sense the difference between the current flowing in the hot conductor 30 and the current flowing in the neutral conductor 30.

Figure 9:
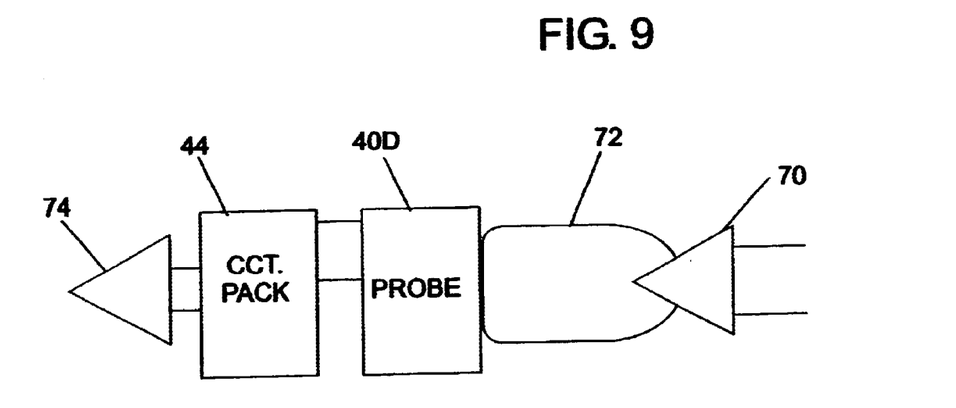
FIG. 9 illustrates the use of a magnetic sensor as a non-invasive circuit connector.

FIG. 9 shows the present invention embodied as a non-invasive, non-contact circuit connector or even as a circuit isolator, used to allow signals to pass in one direction only from one circuit to another circuit without any actual electrical interconnection between the two circuits. The input signals from the one circuit are amplified in an amplifier 70. The output of the amplifier is an electrical current representation of the input signal and is passed through a current-carrying loop 72 near one or two sensor elements (see FIG. 5) contained within a probe 40D. The use of two sensor elements, one on either side of the current-carrying loop 72 (see FIG. 3) obviates any shielding of the probe 40D from the earth's magnetic field and other interference. The probe 40D may be little more than a mounting for the sensor element(s).

The probe 40D is connected to a circuit pack 44 which contains sufficient circuitry (see FIGS. 1 and 4) to reproduce the signals as sensed in the probe 40D. An amplifier 74 can be used if needed to interface the signals to the other circuit. The isolation between the one circuit and the other circuit takes place between the probe 40D and the current-carrying loop 72. The only requirement is that any barrier between the probe 40D and the current-carrying loop 72 must be magnetically permeable in order to convey intelligence from the current-carrying loop 72 to the probe 40D.

Many alternatives are possible for the source of the current in the current-carrying loop 72 of FIG. 9. For example, the source of the current could be a hi-fi amplifier; and the current loop 72 could be a short section of speaker wire that extends from the amplifier 70 to the main loudspeakers of the hi-fi(not shown). In that example, the output of the amplifier 74 of FIG. 9 could be sent to an auxiliary speaker, a recording device, or any other peripheral.

Another alternative of the circuit of FIG. 9 is in a circuit isolator. Since the entire circuit isolator might be manufactured as a part of an overall integrated circuit, it could be made extremely small.

Still another example of the current loop 72 could be a telephone line, either digital or analog, as the current loop 72. The output of the amplifier 74 of FIG. 9 could then drive a loudspeaker or any other receive-only device.

Still another example might be a short section of local area network (LAN) conductor as the current loop 72. In that case, the LAN could be a digital loop carrying data or commands within an automobile or a structure, such as a smart or intelligent house, to carry instructions to peripherals such as lamps, heaters, etc. The loop carries an address byte at the beginning of each command to a peripheral. In such a system, all of the peripherals monitor the loop. When a peripheral recognizes its own address, it then receives, decodes, and executes the command that follows its address. The circuit of FIG. 9 is merely clamped over the LAN conductor, thus obviating the reliability problems associated with most connectors, especially those that must be designed to a price. In all such applications of the circuit of FIG. 9, the output of the amplifier 74 of FIG. 9 could be connected to such receive-only components as an automobile ignition system, a drive motor to open or close drapes in a house, a CRT display, a recording device, a transmitter, etc.

The current loop 72 could actually be a power or other cable either hung on a pole, hidden from view, or preferably buried underground. In order to search for and locate the underground cable in the preferred case, the probe 40D is then swung back and forth over the ground, using some indication device such as that shown in connection with FIG. 5. Alternatively, the probe could be more sophisticated, as described below in connection with FIG. 12.

Figure 10:
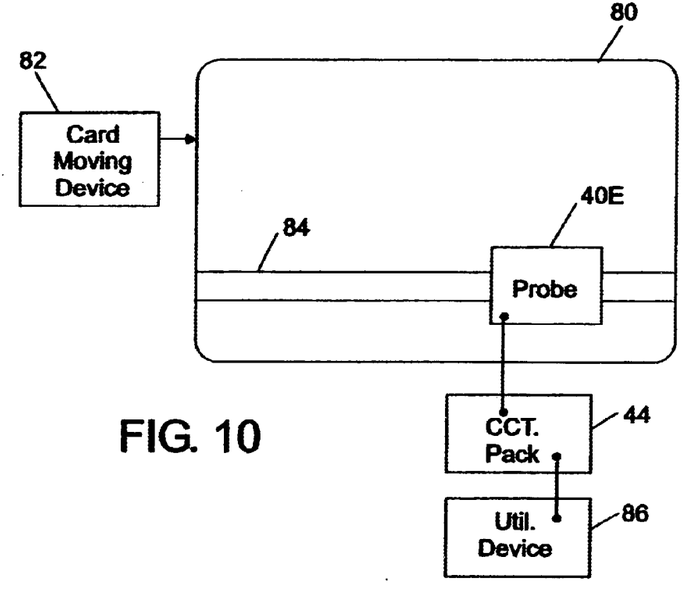
FIG. 10 shows the use of a magnetic sensor functioning as a magnetic strip reader.

Since the sensor elements (see FIG. 5) can be made small enough to be formed on an integrated circuit, they can even be made small enough to be mounted in a magnetic card reader, such as that illustrated schematically in FIG. 10. A credit card 80, for example, is conveyed past the probe 40E in a groove or slot, or a probe 40E is wiped across the magnetic strip 84 on the credit card 80. The credit card 80 and the probe 40E can be moved relative to each other either manually or by the power-driving device represented schematically by the conveying means 82.

The micro manufacturing of the probe 40E includes sufficient flux guiding structure, as in a conventional magnetic read/write head, so as to enable it to read magnet bits of reasonable density on the magnetic strip 84 on the card 80. A circuit pack 44 contains sufficient electronics (see FIGS. 1 and 4) to deliver sensed bits to a conventional utilization device 86.

Figure 11:
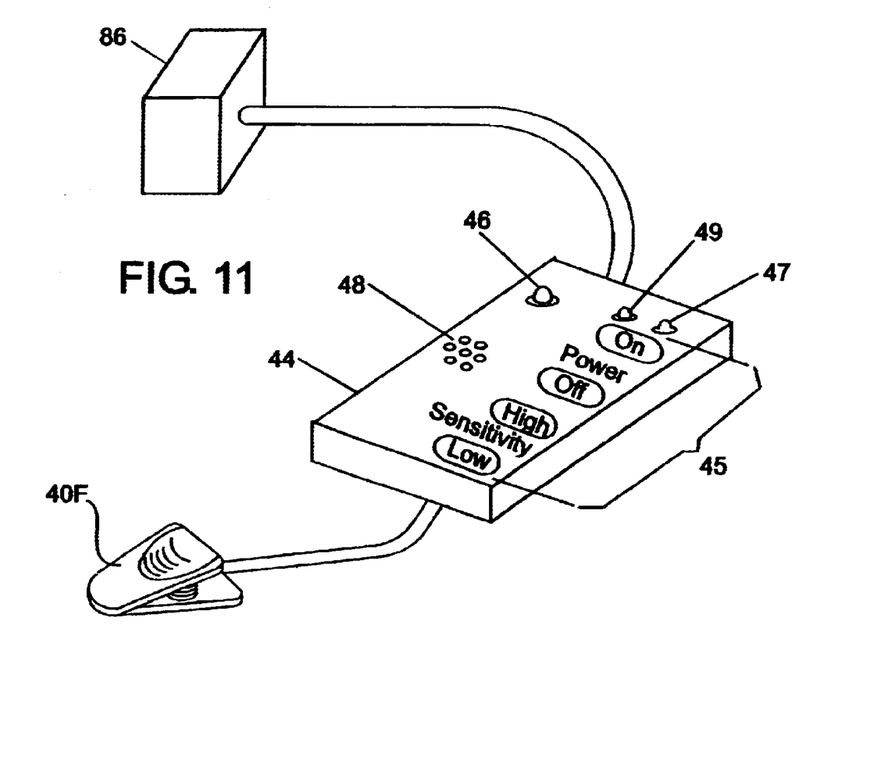
FIG. 11 shows one example of the use of the sensor circuit of FIG. 5 for easy application to accessible electrical conductors.

Referring now to. FIG. 11, a clamping arrangement is shown for use with the probe 40F. In such an arrangement, each of the two sensor elements (not shown in FIG. 11, but see FIG. 3) would be on the inside of one of the jaws of the clamping probe 40F. Therefore, when the clamping probe 40F is clamped to a conductor—much like an alligator clip commonly used—it will hold itself in place without undue care by the technician.

As in the case of the embodiment shown in FIG. 5, a circuit pack 44 provides current-representing signals to a utilization device 86 as an alternative of the light 46 and the sounder 48 of FIG. 5. The utilization device 86 can be a digital voltmeter, an oscilloscope or almost any other indicating device imaginable.

As a packaging convenience, the probe 40F can be incorporated into the case structure of the circuit pack 44, thus avoiding the cost and reliability risk of a flexible cable.

Figure 12:
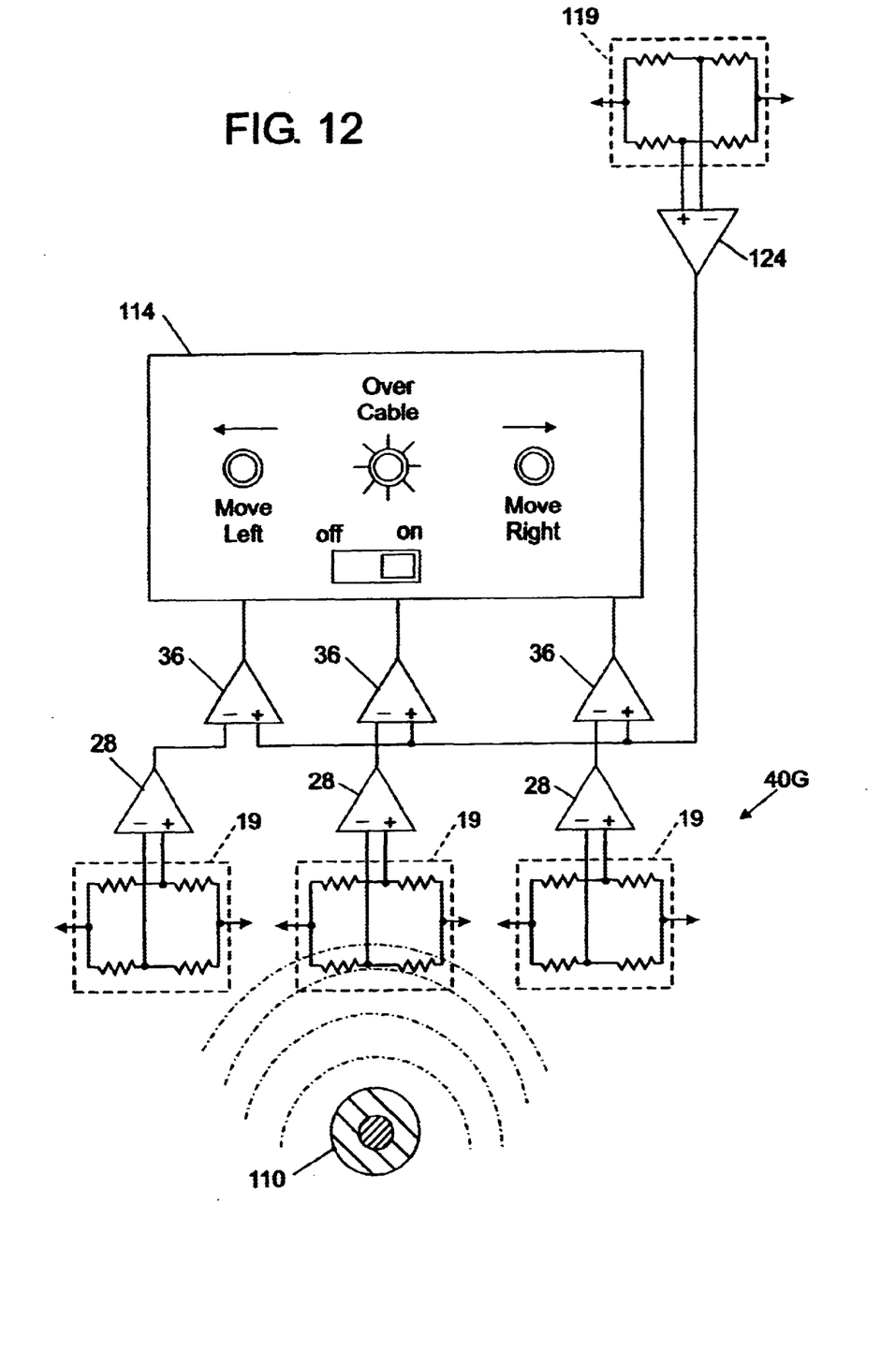
FIG. 12 shows one example of the use of the sensor circuit of FIG. 5 for locating hidden or buried electrical conductors carrying electrical current.

Referring now to FIG. 12, in order more readily to search for and locate a current-carrying underground or hidden cable 110, a probe 40G comprises three sensor elements 19 spaced apart in a line across a horizontal bar (not shown). As described in connection with FIG. 1, each sensor element 19 delivers inputs to a differential amplifier 28. That horizontal bar is preferably connected via an upright member (also not shown) to a panel 114 that contains any necessary controls such as an on-off switch, a battery or other power source (not shown separately in FIG. 12), and any convenient readout device(s). In the preferred embodiment, the readout device comprises three lights which are provided with labels to tell the technician which way to move the horizontal bar (and thus the probe 40G). Which light is illuminated depends upon which sensor element 19 is experiencing a significant magnetic field and is thus nearest to the underground cable. When the center light is illuminated, the center sensor element 19 of the probe 40G is approximately located over the cable.

In order to minimize the influence of the earth's magnetic field and other gross magnetic anomalies, the output of the three differential amplifiers 28 provides one input of three other differential amplifiers 36 (see FIG. 4). A fourth sensor element 119 is preferably located within the panel 114 and experiences the earth's magnetic field or other generalized magnetic environment to substantially the same extent as the three sensor elements 19 along the horizontal bar. Therefore, the two output wires of the fourth sensor element 119 are connected to the two inputs of a fourth differential amplifier 124; and the output of the fourth differential amplifier 124 provides the other input to each of the three differential amplifiers 36 (comparable to FIG. 4). Consequently, the outputs of the three differential amplifiers 28 are compared with the output of the fourth differential amplifier 124. Any difference represents the magnetic field generated by the underground cable that is under the corresponding sensor element 19 and is thus reflected in the output of the associated differential amplifier 36.

The outputs of the three differential amplifiers 36 drive the three lights in the panel 114 to tell the technician which way to swing the probe 40G or if the probe is centered over the cable.

the outputs of the differential amplifiers 36 drive the three lights in the panel 114 to tell the technician which way to swing the probe is centered over the cable.

The conception and the specific embodiments disclosed above may be readily utilized as a basis for modifying or designing other structures for carrying out the purposes of the present invention. Such equivalent constructions do not depart from the spirit and scope of the invention as set forth in the appended claims.

I claim:

1. A device for non-contact sensing of an electromagnetic phenomenon occurring in a magnetic field that constitutes a magnetic environment, comprising:
   a probe, comprising a portion of said device for placement within the magnetic environment;
   means for varying the magnetic environment in a manner having periodicity;
   at least one magnetic sensor element in the probe, which experiences a change in an electrical characteristic thereof in response to a change in the magnetic environment of the at least one magnetic sensor element caused by the varying of the magnetic environment into which the probe is placed, the at least one magnetic sensor element comprising a giant magnetoresistive sensor;
   sensing means, associated with the at least one magnetic sensor element that is positioned within the magnetic environment, for producing an electrical signal representative of the changed electrical characteristic;
   delivering means responsive to sensing said periodicity in the electrical signal and for delivering a usable representation in response to the sensing of said periodicity;
   means for supplying electrical operating energy to the sensing means and the delivering means; and
   wherein the means for varying the magnetic environment comprises an oscillator, the output of which produces a periodically-varying electrical current in a conductor, whereby the magnetic field surrounding the current-carrying conductor is sensed by the at least one magnetic sensor element, and wherein the oscillator is arranged to be inserted into a fuse socket as a replacement for a fuse, in order to apply the oscillator output to one or more conductors comprising the circuit which a fuse in said fuse socket is to protect.

2. A device according to claim 1 wherein the probe includes means for fastening the probe to the end of a mounting member to enable manually passing the at least one magnetic sensor element along an electrical conductor in a relatively inaccessible location in order to sense the presence in the conductor of an electrical current periodically varying with said periodicity.

3. A device for non-contact sensing of an electromagnetic phenomenon occurring in a magnetic field that constitutes a magnetic environment, comprising:

a probe, comprising a portion of said device, for placement within the magnetic environment;

means for varying the magnetic environment in a manner having periodicity;

at least one magnetic sensor element in the probe, which experiences a change in an electrical characteristic thereof in response to a change in the magnetic environment of the at least one magnetic sensor element caused by the varying of the magnetic environment into which the probe is placed, the at least one magnetic sensor element comprising a giant magnetoresistive sensor;

sensing means, associated with the at least one magnetic sensor element that is positioned within the magnetic environment, for producing an electrical signal representative of the changed electrical characteristic;

delivering means responsive to sensing said periodicity in the electrical signal and for delivering a usable representation in response to the sensing of said periodicity;

means for supplying electrical operating energy to the sensing means and the delivering means; and wherein the means for varying the magnetic environment comprises an oscillator, the output of which produces a periodically-varying electrical current in a conductor, whereby the magnetic field surrounding the current-carrying conductor is sensed by the at least one magnetic sensor element, and wherein the oscillator is arranged to be plugged into a shorted circuit of which the conductor forms a part, the shorted circuit not being electrically energized except by said oscillator.

4. A device according to claim 3 wherein the probe includes means for fastening the probe to the end of a mounting member to enable manually passing the at least one magnetic sensor element along an electrical conductor in a relatively inaccessible location in order to sense the presence in the conductor of an electrical current periodically varying with said periodicity.

5. A device for non-contact sensing of an electromagnetic phenomenon occurring in a magnetic field that constitutes a magnetic environment, comprising:

a probe, comprising a portion of said device, for placement within the magnetic environment;

means for varying the magnetic environment in a manner having periodicity;

at least one magnetic sensor element in the probe, which experiences a change in an electrical characteristic thereof in response to a change in the magnetic environment of the at least one magnetic sensor element caused by the varying of the magnetic environment into which the probe is placed, the at least one magnetic sensor element comprising a Hall effect sensor;

sensing means, associated with the at least one magnetic sensor element that is positioned within the magnetic environment, for producing an electrical signal representative of the changed electrical characteristic;

delivering means responsive to sensing said periodicity in the electrical signal and for delivering a usable representation in response to the sensing of said periodicity;

means for supplying electrical operating energy to the sensing means and the delivering means; and wherein the means for varying the magnetic environment comprises an oscillator, the output of which produces a periodically-varying electrical current in a conductor, whereby the magnetic field surrounding the current-carrying conductor is sensed by the at least one magnetic sensor element, and wherein the oscillator is arranged to be inserted into a fuse socket as a replacement for a fuse, in order to apply the oscillator output to one or more conductors comprising the circuit which a fuse in said fuse socket is to protect.

6. A device according to claim 5 wherein the probe includes means for fastening the probe to the end of a mounting member to enable manually passing the at least one magnetic sensor element along an electrical conductor in a relatively inaccessible location in order to sense the presence in the conductor of an electrical current periodically varying with said periodicity.

7. A device for non-contact sensing of an electromagnetic phenomenon occurring in a magnetic field that constitutes a magnetic environment, comprising:

a probe, comprising a portion of said device, for placement within the magnetic environment;

means for varying the magnetic environment in a manner having periodicity;

at least one magnetic sensor element in the probe, which experiences a change in an electrical characteristic thereof in response to a change in the magnetic environment of the at least one magnetic sensor element caused by the varying of the magnetic environment into which the probe is placed, the at least one magnetic sensor element comprising a Hall effect sensor;

sensing means, associated with the at least one magnetic sensor element that is positioned within the magnetic environment, for producing an electrical signal representative of the changed electrical characteristic;

delivering means responsive to sensing said periodicity in the electrical signal and for delivering a usable representation in response to the sensing of said periodicity;

means for supplying electrical operating energy to the sensing means and the delivering means; and wherein the means for varying the magnetic environment comprises an oscillator, the output of which produces a periodically-varying electrical current in a conductor, whereby the magnetic field surrounding the current-carrying conductor is sensed by the at least one magnetic sensor element, and wherein the oscillator is arranged to be plugged into a shorted circuit of which the conductor forms a part, the shorted circuit not being electrically energized except by said oscillator.

8. A device according to claim 7 wherein the probe includes means for fastening the probe to the end of a mounting member to enable manually passing the at least one magnetic sensor element along an electrical conductor in a relatively inaccessible location in order to sense the presence in the conductor of an electrical current periodically varying with said periodicity.

9. A device for non-contact sensing of an electromagnetic phenomenon occurring in a magnetic field that constitutes a magnetic environment, comprising:

a probe, comprising a portion of said device, for placement within the magnetic environment;

means for varying the magnetic environment in a manner having periodicity;

at least one magnetic sensor element in the probe, which experiences a change in an electrical characteristic thereof in response to a change in the magnetic environment of the at least one magnetic sensor element caused by the varying of the magnetic environment into which the probe is placed, the at least one magnetic sensor element comprising a anisotropic magnetoresistive sensor;

sensing means, associated with the at least one magnetic sensor element that is positioned within the magnetic environment, for producing an electrical signal representative of the changed electrical characteristic;

delivering means responsive to sensing said periodicity in the electrical signal and for delivering a usable representation in response to the sensing of said periodicity;

means for supplying electrical operating energy to the sensing means and the delivering means; and wherein the means for varying the magnetic environment comprises an oscillator, the output of which produces a periodically-varying electrical current in a conductor, whereby the magnetic field surrounding the current-carrying conductor is sensed by the at least one magnetic sensor element, and wherein the oscillator is arranged to be inserted into a fuse socket as a replacement for a fuse, in order to apply the oscillator output to one or more conductors comprising the circuit which a fuse in said fuse socket is to protect.

10. A device according to claim 9 wherein the probe includes means for fastening the probe to the end of a mounting member to enable manually passing the at least one magnetic sensor element along an electrical conductor in a relatively inaccessible location in order to sense the presence in the conductor of an electrical current periodically varying with said periodicity.

11. A device for non-contact sensing of an electromagnetic phenomenon occurring in a magnetic field that constitutes a magnetic environment, comprising:

a probe, comprising a portion of said device, for placement within the magnetic environment;

means for varying the magnetic environment in a manner having periodicity;

at least one magnetic sensor element in the probe, which experiences a change in an electrical characteristic thereof in response to a change in the magnetic environment of the at least one magnetic sensor element caused by the varying of the magnetic environment into which the probe is placed, the at least one magnetic sensor element comprising a anisotropic magnetoresistive sensor;

sensing means, associated with the at least one magnetic sensor element that is positioned within the magnetic environment, for producing an electrical signal representative of the changed electrical characteristic;

delivering means responsive to sensing said periodicity in the electrical signal and for delivering a usable representation in response to the sensing of said periodicity;

means for supplying electrical operating energy to the sensing means and the delivering means; and wherein the means for varying the magnetic environment comprises an oscillator, the output of which produces a periodically-varying electrical current in a conductor, whereby the magnetic field surrounding the current-carrying conductor is sensed by the at least one magnetic sensor element, and wherein the oscillator is arranged to be plugged into a shorted circuit of which the conductor forms a part, the shorted circuit not being electrically energized except by said oscillator.

12. A device according to claim 11 wherein the probe includes means for fastening the probe to the end of a mounting member to enable manually passing the at least one magnetic sensor element along an electrical conductor in a relatively inaccessible location in order to sense the presence in the conductor of an electrical current periodically varying with said periodicity.

13. A device for non-contact sensing of an electromagnetic phenomenon occurring in a magnetic field that constitutes a magnetic environment, comprising:

a probe, comprising a portion of said device, for placement within the magnetic environment;

means for varying the magnetic environment in a manner having periodicity;

at least one magnetic sensor element in the probe, which experiences a change in an electrical characteristic thereof in response to a change in the magnetic environment of the at least one magnetic sensor element caused by the varying of the magnetic environment into which the probe is placed;

sensing means, associated with the at least one magnetic sensor element that is positioned within the magnetic environment, for producing an electrical signal representative of the changed electrical characteristic;

delivering means responsive to sensing said periodicity in the electrical signal and for delivering a usable representation in response to the sensing of said periodicity;

means for supplying electrical operating energy to the sensing means and the delivering means; and wherein the means for varying the magnetic environment comprises an oscillator, the output of which produces a periodically-varying electrical current in a conductor, whereby the magnetic field surrounding the current-carrying conductor is sensed by the at least one magnetic sensor element, and wherein the oscillator is arranged to be inserted into a fuse socket as a replacement for a fuse, in order to apply the oscillator output to one or more conductors comprising the circuit which a fuse in said fuse socket is to protect.

14. A device according to claim 13 wherein the probe includes means for fastening the probe to the end of a mounting member to enable manually passing the at least one magnetic sensor element along an electrical conductor in a relatively inaccessible location in order to sense the presence in the conductor of an electrical current periodically varying with said periodicity.

15. A device for non-contact sensing of an electromagnetic phenomenon occurring in a magnetic field that constitutes a magnetic environment, comprising:

a probe, comprising a portion of said device, for placement within the magnetic environment;

means for varying the magnetic environment in a manner having periodicity;

at least one magnetic sensor element in the probe, which experiences a change in an electrical characteristic thereof in response to a change in the magnetic environment of the at least one magnetic sensor element caused by the varying of the magnetic environment into which the probe is placed;

sensing means, associated with the at least one magnetic sensor element that is positioned within the magnetic environment, for producing an electrical signal representative of the changed electrical characteristic;

delivering means responsive to sensing said periodicity in the electrical signal and for delivering a usable representation in response to the sensing of said periodicity;

means for supplying electrical operating energy to the sensing means and the delivering means; and wherein the means for varying the magnetic environment comprises an oscillator, the output of which produces a periodically-varying electrical current in a conductor, whereby the magnetic field surrounding the current-carrying conductor is sensed by the at least one magnetic sensor element, and wherein the oscillator is arranged to be plugged into a shorted circuit of which the conductor forms a part, the shorted circuit not being electrically energized except by said oscillator.

16. A device according to claim 15 wherein the probe includes means for fastening the probe to the end of a mounting member to enable manually passing the at least one magnetic sensor element along an electrical conductor in a relatively inaccessible location in order to sense the presence in the conductor of an electrical current periodically varying with said periodicity.

* * * * *